United States Patent
Khlat

(10) Patent No.: US 10,158,329 B1
(45) Date of Patent: Dec. 18, 2018

(54) ENVELOPE TRACKING POWER AMPLIFIER CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

(*) Notice: Subject to any disclaimer, the term of this patent is extended or adjusted under 35 U.S.C. 154(b) by 0 days.

(21) Appl. No.: 15/704,131

(22) Filed: Sep. 14, 2017

Related U.S. Application Data

(60) Provisional application No. 62/533,176, filed on Jul. 17, 2017.

(51) Int. Cl.
| | | |
|---|---|---|
| H03F 1/02 | (2006.01) | |
| H03F 1/56 | (2006.01) | |
| H03F 3/189 | (2006.01) | |
| H03F 3/20 | (2006.01) | |

(52) U.S. Cl.
CPC ............ H03F 1/0211 (2013.01); H03F 1/56 (2013.01); H03F 3/189 (2013.01); H03F 3/20 (2013.01); *H03F 2200/102* (2013.01); *H03F 2200/387* (2013.01); *H03F 2200/451* (2013.01)

(58) Field of Classification Search
CPC .................................................... H03F 1/0211
See application file for complete search history.

(56) References Cited

U.S. PATENT DOCUMENTS

| | | | |
|---|---|---|---|
| 7,043,213 B2 | 5/2006 | Robinson et al. | |
| 7,471,155 B1 | 12/2008 | Levesque | |
| 7,570,931 B2 | 8/2009 | McCallister et al. | |
| 8,461,928 B2 | 6/2013 | Yahav et al. | |
| 8,879,665 B2 | 11/2014 | Xia et al. | |
| 8,913,690 B2 | 12/2014 | Onishi | |
| 8,989,682 B2 | 3/2015 | Ripley et al. | |
| 9,041,365 B2 | 5/2015 | Kay et al. | |
| 9,098,099 B2 | 8/2015 | Park et al. | |
| 9,166,830 B2 | 10/2015 | Camuffo et al. | |
| 9,225,362 B2 | 12/2015 | Drogi et al. | |
| 9,263,997 B2 | 2/2016 | Vinayak | |

(Continued)

OTHER PUBLICATIONS

Non-Final Office Action for U.S. Appl. No. 15/792,909, dated May 18, 2018, 13 pages.

(Continued)

*Primary Examiner* — Patricia T Nguyen
(74) *Attorney, Agent, or Firm* — Withrow & Terranova, P.L.L.C.

(57) ABSTRACT

An envelope tracking (ET) power amplifier circuit is disclosed. The ET power amplifier circuit includes ET tracker circuitry configured to output an ET modulated output voltage having an output voltage envelope that tracks a target voltage envelope of an ET modulated target voltage. Impedance adjustment circuitry in the ET power amplifier circuit is provided between a first node and a second node coupled to a feedback voltage input and a voltage output of the ET tracker circuitry, respectively. A power amplifier circuit(s) includes a first amplifier and a second amplifier coupled respectively to the first node and the second node. As such, it is possible to configure the impedance adjustment circuitry to provide adjustment impedance to offset output impedance of the ET tracker circuitry, thus helping to reduce voltage error in the ET power amplifier circuit.

20 Claims, 6 Drawing Sheets

(56) References Cited

U.S. PATENT DOCUMENTS

| | | | |
|---|---|---|---|
| 9,280,163 B2 * | 3/2016 | Kay | G05F 1/46 |
| 9,288,098 B2 | 3/2016 | Yan et al. | |
| 9,344,304 B1 | 5/2016 | Cohen | |
| 9,356,512 B2 | 5/2016 | Chowdhury et al. | |
| 9,520,907 B2 | 12/2016 | Peng et al. | |
| 9,584,071 B2 | 2/2017 | Khlat | |
| 9,595,981 B2 | 3/2017 | Khlat | |
| 9,748,845 B1 | 8/2017 | Kotikalapoodi | |
| 9,806,676 B2 * | 10/2017 | Balteanu | H03F 1/0266 |
| 9,923,520 B1 | 3/2018 | Abdelfattah et al. | |
| 2009/0045872 A1 | 2/2009 | Kenington | |
| 2011/0136452 A1 | 6/2011 | Pratt et al. | |
| 2012/0194274 A1 | 8/2012 | Fowers et al. | |
| 2013/0021827 A1 | 1/2013 | Ye | |
| 2013/0187711 A1 | 7/2013 | Goedken et al. | |
| 2014/0009226 A1 | 1/2014 | Severson et al. | |
| 2014/0155002 A1 | 6/2014 | Dakshinamurthy et al. | |
| 2014/0210550 A1 | 7/2014 | Mathe et al. | |
| 2014/0218109 A1 | 8/2014 | Wimpenny | |
| 2014/0266428 A1 | 9/2014 | Chiron et al. | |
| 2014/0315504 A1 | 10/2014 | Sakai et al. | |
| 2014/0361830 A1 | 12/2014 | Mathe et al. | |
| 2015/0188432 A1 * | 7/2015 | Vannorsdel | H02M 3/156 323/271 |
| 2015/0236654 A1 * | 8/2015 | Jiang | H03F 1/0233 330/279 |
| 2015/0236729 A1 * | 8/2015 | Peng | H04B 1/0475 455/114.3 |
| 2015/0280652 A1 | 10/2015 | Cohen | |
| 2015/0333781 A1 * | 11/2015 | Alon | H03F 1/3247 370/277 |
| 2016/0065137 A1 | 3/2016 | Khlat | |
| 2016/0099687 A1 | 4/2016 | Khlat | |
| 2016/0105151 A1 | 4/2016 | Langer | |
| 2016/0118941 A1 | 4/2016 | Wang | |
| 2016/0197627 A1 | 7/2016 | Qin et al. | |
| 2017/0317913 A1 | 11/2017 | Kim et al. | |
| 2017/0338773 A1 | 11/2017 | Balteanu et al. | |
| 2018/0048276 A1 | 2/2018 | Khlat et al. | |
| 2018/0076772 A1 | 3/2018 | Khesbak et al. | |

OTHER PUBLICATIONS

Non-Final Office Action for U.S. Appl. No. 14/836,634, dated May 16, 2016, 9 pages.

Non-Final Office Action for U.S. Appl. No. 14/868,890, dated Jul. 14, 2016, 13 pages.

Notice of Allowance for U.S. Appl. No. 15/459,449, dated Mar. 28, 2018, 7 pages.

Notice of Allowance for U.S. Appl. No. 15/723,460, dated Jul. 24, 2018, 8 pages.

Notice of Allowance for U.S. Appl. No. 15/728,202, dated Aug. 2, 2018, 7 pages.

* cited by examiner

ENVELOPE TRACKING POWER AMPLIFIER CIRCUIT

RELATED APPLICATIONS

This application claims the benefit of U.S. Provisional Patent Application Ser. No. 62/533,176, filed Jul. 17, 2017, which is incorporated herein by reference in its entirety.

FIELD OF THE DISCLOSURE

The technology of the disclosure relates generally to a power amplifier circuit in wireless communication devices.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires a higher data rate offered by wireless communication technologies, such as fifth generation new radio (5G-NR) that typically operates in millimeter wave frequency spectrums. To achieve the higher data rate in mobile communication devices, sophisticated power amplifiers (PAs) may be employed to increase output power of radio frequency (RF) signals (e.g., maintaining sufficient energy per bit) communicated by mobile communication devices. However, the increased output power of RF signals can lead to increased power consumption and thermal dissipation in mobile communication devices, thus compromising overall performance and user experiences.

Envelope tracking is a power management technology designed to improve efficiency levels of the PAs to help reduce power consumption and thermal dissipation in mobile communication devices. As the name suggests, an envelope tracking system keeps track of an amplitude envelope of the RF signals communicated by mobile communication devices. The envelope tracking system constantly adjusts supply voltages applied to the PAs to ensure that the RF PAs are operating at a higher efficiency for a given instantaneous output power requirement of the RF signals. In this regard, efficiency of the envelope tracking system can impact overall power consumption and RF performance of the mobile communication devices, particularly in the millimeter wave frequency spectrums.

SUMMARY

Aspects disclosed in the detailed description include an envelope tracking (ET) power amplifier circuit. The ET power amplifier circuit includes ET tracker circuitry configured to output an ET modulated output voltage having an output voltage envelope that tracks a target voltage envelope of an ET modulated target voltage. In examples discussed herein, the ET tracker circuitry has an output impedance that can cause a voltage error between the output voltage envelope and the target voltage envelope, thus compromising performance of the ET power amplifier circuit. Impedance adjustment circuitry in the ET power amplifier circuit is provided between a first node and a second node coupled to a feedback voltage input and a voltage output of the ET tracker circuitry, respectively. A power amplifier circuit(s) includes a first amplifier and a second amplifier coupled respectively to the first node and the second node. As such, it is possible to configure the impedance adjustment circuitry to provide adjustment impedance to offset the output impedance of the ET tracker circuitry, thus helping to reduce the voltage error in the ET power amplifier circuit.

In one aspect, an ET power amplifier circuit is provided. The ET power amplifier circuit includes ET tracker circuitry having an output impedance and configured to receive an ET modulated target voltage having a target voltage envelope at a voltage input and generate an ET modulated output voltage having an output voltage envelope tracking the target voltage envelope at a voltage output. The ET power amplifier circuit also includes impedance adjustment circuitry comprising a first node coupled to a feedback voltage input of the ET tracker circuitry and a second node coupled to the voltage output. The impedance adjustment circuitry is configured to provide an adjustment impedance between the first node and the second node. The ET power amplifier circuit also includes at least one power amplifier circuit. The at least one power amplifier circuit includes a first amplifier comprising a first voltage input coupled to the first node of the impedance adjustment circuitry. The at least one power amplifier circuit also includes a second amplifier comprising a second voltage input coupled to the second node of the impedance adjustment circuitry.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

Figure 1A:
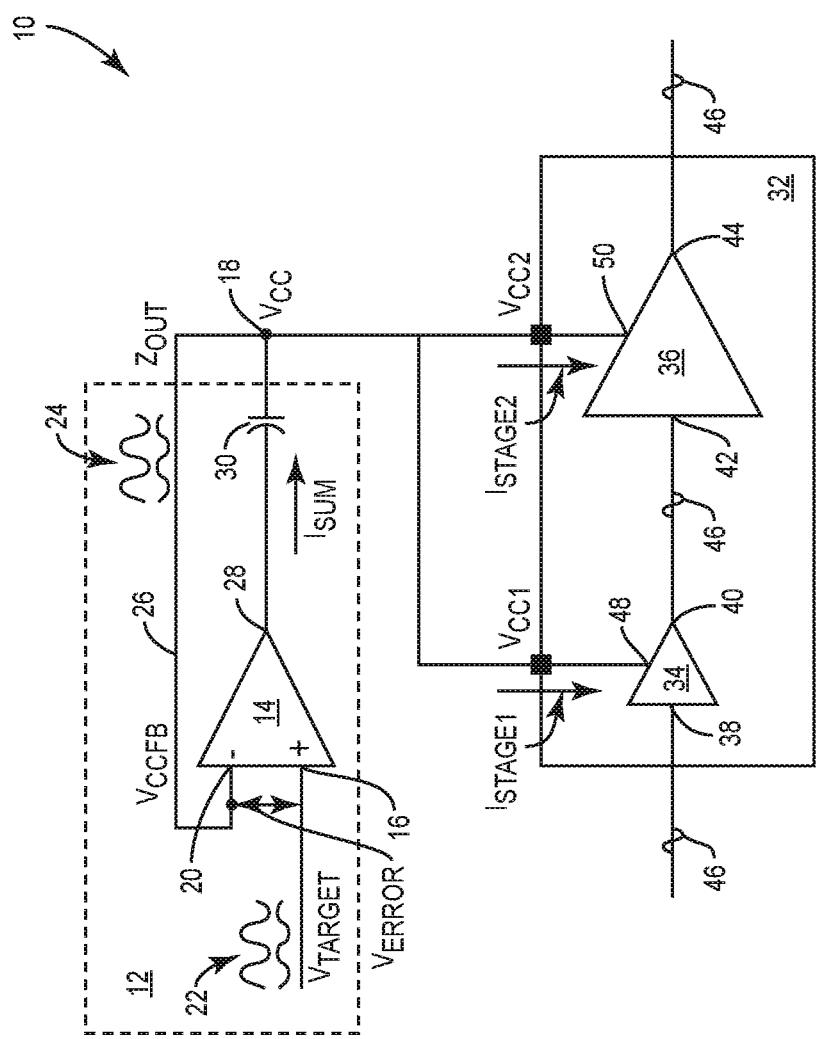
FIG. 1A is a schematic diagram of a conventional envelope tracking (ET) power amplifier circuit including ET tracker circuitry configured to generate an ET modulated output voltage based on an ET modulated target voltage.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include an envelope tracking (ET) power amplifier circuit. The ET power amplifier circuit includes ET tracker circuitry configured to output an ET modulated output voltage having an output voltage envelope that tracks a target voltage envelope of an ET modulated target voltage. In examples discussed herein, the ET tracker circuitry has an output impedance that can cause a voltage error between the output voltage envelope and the target voltage envelope, thus compromising performance of the ET power amplifier circuit. Impedance adjustment circuitry in the ET power amplifier circuit is provided between a first node and a second node coupled to a feedback voltage input and a voltage output of the ET tracker circuitry, respectively. A power amplifier circuit(s) includes a first amplifier and a second amplifier coupled respectively to the first node and the second node. As such, it is possible to configure the impedance adjustment circuitry to provide adjustment impedance to offset the output impedance of the ET tracker circuitry, thus helping to reduce the voltage error in the ET power amplifier circuit.

Figure 1B:
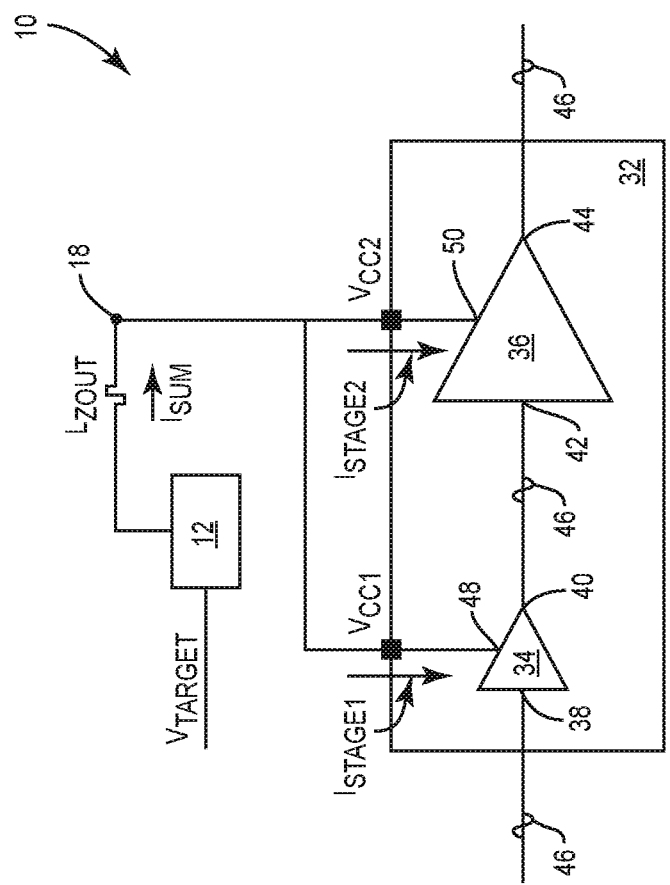
FIG. 1B is a schematic diagram showing that an output impedance of an ET tracker circuitry in the ET power amplifier circuit of FIG. 1A can be modeled by an output inductance.

Before discussing the ET power amplifier circuit of the present disclosure, a brief discussion of a conventional ET power amplifier circuit and potential issues related to the conventional RF power amplifier circuit are first provided with reference to FIGS. 1A-1B. The discussion of specific exemplary aspects of an ET power amplifier circuit starts below with reference to FIG. 2.

FIG. 1A is a schematic diagram of a conventional ET power amplifier circuit 10 including ET tracker circuitry 12 configured to generate an ET modulated output voltage $V_{CC}$ based on an ET modulated target voltage $V_{TARGET}$. The ET tracker circuitry 12 includes at least one ET tracker 14 having a voltage input 16, a voltage output 18, and a feedback voltage input 20. The ET tracker 14 is configured to receive the ET modulated target voltage $V_{TARGET}$ at the voltage input 16 and generate the ET modulated output voltage $V_{CC}$ at the voltage output 18 based on the ET modulated target voltage $V_{TARGET}$. The ET modulated target voltage $V_{TARGET}$ is modulated according to a target voltage envelope 22. The ET modulated output voltage $V_{CC}$ is modulated according to an output voltage envelope 24 that tracks the target voltage envelope 22. The ET tracker 14 includes a feedback path 26 configured to provide a feedback voltage $V_{CCFB}$, which may be a snapshot or mirrored copy of the ET modulated output voltage $V_{CC}$, from the voltage output 18 to the feedback voltage input 20. The ET tracker 14 is configured to compare the feedback voltage $V_{CCFB}$ against the ET modulated target voltage $V_{TARGET}$ and adjust the ET modulated target voltage $V_{TARGET}$ accordingly. The ET tracker 14 has an output end 28 coupled to the voltage output 18 via an offset capacitor 30. The offset capacitor 30 is configured to raise an ET modulated voltage at the output end 28 to the ET modulated output voltage $V_{CC}$ at the voltage output 18.

The conventional ET power amplifier circuit 10 includes at least one power amplifier circuit 32. The power amplifier circuit 32 includes a first amplifier 34 and a second amplifier 36. The first amplifier 34 includes a first signal input 38 and a first signal output 40. The second amplifier 36 includes a second signal input 42 and a second signal output 44. In a non-limiting example, the power amplifier circuit 32 is configured to be a serial power amplifier circuit. In this regard, the first signal output 40 of the first amplifier 34 is coupled to the second signal input 42 of the second amplifier 36. Accordingly, the first amplifier 34 functions as a driver stage amplifier and the second amplifier 36 functions as an output stage amplifier. The first amplifier 34 receives a radio frequency (RF) signal 46 at the first signal input 38 and outputs the RF signal 46 at the first signal output 40. The second amplifier 36, in turn, receives the RF signal 46 at the second signal input 42 and outputs the RF signal 46 at the second signal output 44.

The first amplifier 34 has a first supply voltage input 48 coupled to the voltage output 18 to receive the ET modulated output voltage $V_{CC}$ as a first ET modulated supply voltage $V_{CC1}$. The first ET modulated supply voltage $V_{CC1}$ induces a first current $I_{STAGE1}$ flowing through the first amplifier 34. The second amplifier 36 has a second supply voltage input 50 also coupled to the voltage output 18 to receive the ET modulated output voltage $V_{CC}$ as a second ET modulated supply voltage $V_{CC2}$. The second ET modulated supply voltage $V_{CC2}$ induces a second current $I_{STAGE2}$ flowing through the second amplifier 36. A sum of the first current $I_{STAGE1}$ and the second current $I_{STAGE2}$ equals a current $I_{SUM}$ generated by the ET tracker 14. The first current $I_{STAGE1}$ and the second current $I_{STAGE2}$ determine a current ratio K, which can be expressed in equation (Eq. 1) below. In a non-limiting example, the current ratio K is greater than one (1), an indication that the second current $I_{STAGE2}$ is greater than the first current $I_{STAGE1}$.

$$K = I_{STAGE2}/I_{STAGE1} \quad (\text{Eq. 1})$$

The ET tracker circuitry 12 has inherent impedance, which can present at the voltage output 18 as output impedance $Z_{OUT}$. If not properly controlled, the output impedance $Z_{OUT}$ can cause a voltage error $V_{ERROR}$ between the target voltage envelope 22 and the output voltage envelope 24. As a result, the ET modulated voltage $V_{CC}$ at the voltage output 18 may deviate from the target voltage $V_{TARGET}$, thus compromising RF performance of the conventional ET power amplifier circuit 10. Notably, the output impedance $Z_{OUT}$ tends to increase with modulation frequency. In this regard, when the conventional ET power amplifier circuit 10 is used to support such advanced wireless communication technologies as fifth-generation new radio (5G-NR), which typically operate in millimeter wave frequency spectrums, the voltage error $V_{ERROR}$ caused by the output impedance $Z_{OUT}$ may become more severe and acute. Hence, it may be desired to suppress the output impedance $Z_{OUT}$ to help reduce the voltage error $V_{ERROR}$ and thus improve the RF performance of the conventional ET power amplifier circuit 10, especially for supporting the 5G-NR technologies.

In a non-limiting example, the output impedance $Z_{OUT}$ can be modeled as being primarily determined by an output inductance $L_{ZOUT}$, as shown in FIG. 1B. FIG. 1B is a schematic diagram showing that the output impedance $Z_{OUT}$ of the ET tracker circuitry 12 of FIG. 1A can be modeled by the output inductance $L_{ZOUT}$. Impact of the output inductance $L_{ZOUT}$ on the ET modulated output voltage $V_{CC}$ can be expressed in equation (Eq. 2) below.

$$V_{CC} = V_{TARGET} - L_{ZOUT} * dI_{SUM}/dt$$

$$= V_{TARGET} - L_{ZOUT} * d(I_{STAGE1} + I_{STAGE2})/dt \quad (\text{Eq. 2})$$

As shown in equation (Eq. 2) above, the output inductance $L_{ZOUT}$ contributes to the voltage error $V_{ERROR}$ between the ET modulated target voltage $V_{TARGET}$ and the ET modulated output voltage $V_{CC}$. Thus, to reduce the voltage error $V_{ERROR}$, it is necessary to reduce the output inductance $L_{ZOUT}$ of the ET tracker circuitry 12.

Figure 2:
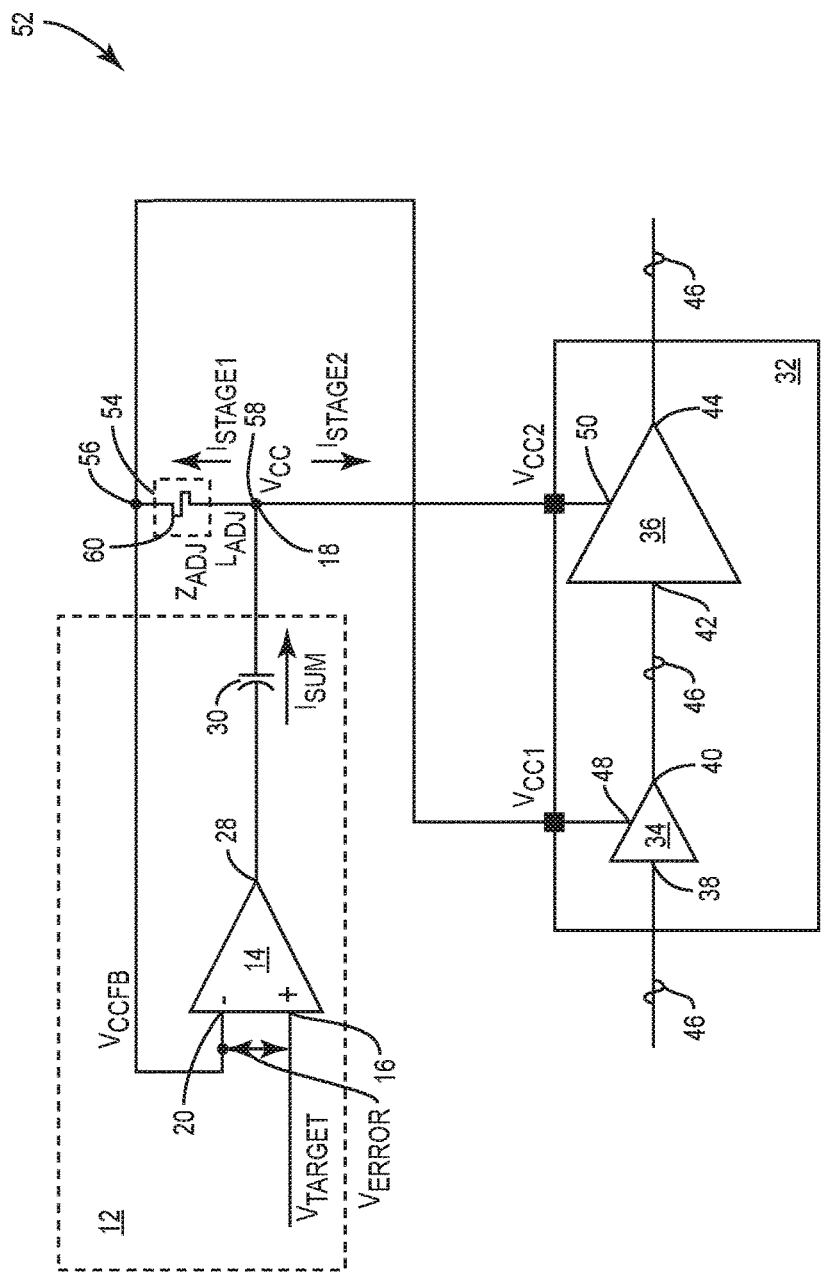
FIG. 2 is a schematic diagram of an exemplary ET power amplifier circuit configured to reduce output impedance in the conventional ET power amplifier circuit of FIG. 1A to help reduce a voltage error between the ET modulated output voltage and the ET modulated target voltage.

In this regard, FIG. 2 is a schematic diagram of an exemplary ET power amplifier circuit 52 configured to reduce the output impedance $Z_{OUT}$ in the conventional ET power amplifier circuit 10 of FIG. 1A to help reduce the voltage error $V_{ERROR}$ between the ET modulated output voltage $V_{CC}$ and the ET modulated target voltage $V_{TARGET}$. In a non-limiting example, the ET power amplifier circuit 52 can be created based on the conventional ET power amplifier circuit 10 with minimum hardware changes to save cost and provide backward compatibility. As such, the ET power amplifier circuit 52 reuses many of the components and/or circuitries in the conventional ET power amplifier circuit 10. Common elements between FIGS. 1A and 2 are shown therein with common element numbers and will not be re-described herein.

The ET power amplifier circuit 52 includes impedance adjustment circuitry 54 having a first node 56 and a second node 58. The first node 56 is coupled to the feedback voltage input 20 and the second node 58 is coupled to the voltage output 18. The impedance adjustment circuitry 54 is configured to provide adjustment impedance $Z_{ADJ}$ between the first node 56 and the second node 58 to offset the output impedance $Z_{OUT}$ of the ET tracker circuitry 12 and thus to reduce the voltage error $V_{ERROR}$ between the ET modulated output voltage $V_{CC}$ and the ET modulate target voltage $V_{TARGET}$.

In the power amplifier circuit 32, the first supply voltage input 48 of the first amplifier 34 is coupled to the first node 56 of the impedance adjustment circuitry 54. The second supply voltage input 50 of the second amplifier 36 is coupled to the second node 58 of the impedance adjustment circuitry 54 and thus the voltage output 18.

As previously discussed in FIGS. 1A and 1B, the output impedance $Z_{OUT}$ of the ET tracker circuitry 12 can be modeled by the output inductance $L_{ZOUT}$. In this regard, for the impedance adjustment circuitry 54 to offset the output impedance $Z_{OUT}$, the impedance adjustment circuitry 54 should be configured to offset the output inductance $L_{ZOUT}$ of the ET tracker circuitry 12. As such, in a non-limiting example, the impedance adjustment circuitry 54 includes at least one inductor 60 configured to generate an adjustment inductance $L_{ADJ}$ to offset the output inductance $L_{ZOUT}$ of the ET tracker circuitry 12.

As is discussed in details below, the adjustment inductance $L_{ADJ}$ can be determined and configured to vary in proportion to the output inductance $L_{ZOUT}$ and the current ratio K between the second current $I_{STAGE2}$ and the first current $I_{STAGE1}$. Thus, by controlling the adjustment inductance $L_{ADJ}$ of the impedance adjustment circuitry 54 based on the output inductance $L_{ZOUT}$ and the current ratio K, it is possible to offset the output inductance $L_{ZOUT}$ and thus the output impedance $Z_{OUT}$ to help reduce the voltage error $V_{ERROR}$. As a result, the ET power amplifier circuit 52 can support 5G-NR technologies in the millimeter wave frequency spectrums without compromising the RF performance.

In the power amplifier circuit 32, the first amplifier 34 receives the first ET modulated supply voltage $V_{CC1}$ from the first node 56 and the second amplifier 36 receives the second ET modulated supply voltage $V_{CC2}$ from the second node 58. Since the second node 58 is coupled to the voltage output 18, the second ET modulated supply voltage $V_{CC2}$ equals the ET modulated output voltage $V_{CC}$. The relationship between the first ET modulated supply voltage $V_{CC1}$ and the second ET modulated supply voltage $V_{CC2}$ can be expressed by equation (Eq. 3) below.

$$V_{CC2} = V_{CC1} + L_{ADJ} * d(I_{STAGE1})/dt \quad (\text{Eq. 3})$$

As shown in equation (Eq. 3), the second ET modulated supply voltage $V_{CC2}$ is greater than the first ET modulated supply voltage $V_{CC1}$. Further, according to equation (Eq. 1), $I_{STAGE1}$ can be expressed as $I_{STAGE2}/K$. As such, the second ET modulated supply voltage $V_{CC2}$ can be further expressed in equation (Eq. 4) below.

$$V_{CC2}=V_{TARGET}+V_{ERROR}+(L_{ADJ}/K)*d(I_{STAGE2})/dt \quad (Eq. 4)$$

The voltage error $V_{ERROR}$, in the meantime, can be expressed in equation (Eq. 5) below.

$$V_{ERROR}=-L_{ZOUT}*d(I_{SUM})/dt$$

$$=-L_{ZOUT}*d(I_{STAGE1}+I_{STAGE2})/dt$$

$$=-L_{ZOUT}*(1/K+1)*d(I_{STAGE2})/dt \quad (Eq. 5)$$

Accordingly, the second ET modulated supply voltage $V_{CC2}$ can be further expressed in equation (Eq. 6) below.

$$V_{CC2}=V_{TARGET}-L_{ZOUT}*(1/K+1)*d(I_{STAGE2})/dt+ (L_{ADJ}/K)*d(I_{STAGE2})/dt$$

$$=V_{TARGET}-[L_{ZOUT}*(1/K+1)-L_{ADJ}/K]*d(I_{STAGE2})/dt \quad (Eq. 6)$$

Thus, to offset the output inductance $L_{ZOUT}$ and thus the output impedance $Z_{OUT}$, it is necessary for $L_{ZOUT}*(1/K+1)-L_{ADJ}/K$ to be to zero. Accordingly, it is possible to determine the adjustment inductance $L_{ADJ}$ according to equation (Eq. 7) below.

$$L_{ADJ}=(1+K)*L_{ZOUT} \quad (Eq. 7)$$

The equation (Eq. 7) above shows that the adjustment induction $L_{ADJ}$ is proportionally related to the output inductance $L_{ZOUT}$ and the current ratio K. For example, if the output inductance $L_{ZOUT}$ is 1 nH and K equals 4, the adjustment inductance $L_{ADJ}$ of the inductor 60 can be determined based on equation (Eq. 7) as being 5 nH. As a result, the adjustment inductance $L_{ADJ}$ can substantially offset (e.g., at least 90%) the output inductance $L_{ZOUT}$ and thus the output impedance $Z_{OUT}$ to significantly reduce the voltage error $V_{ERROR}$.

Figure 3:
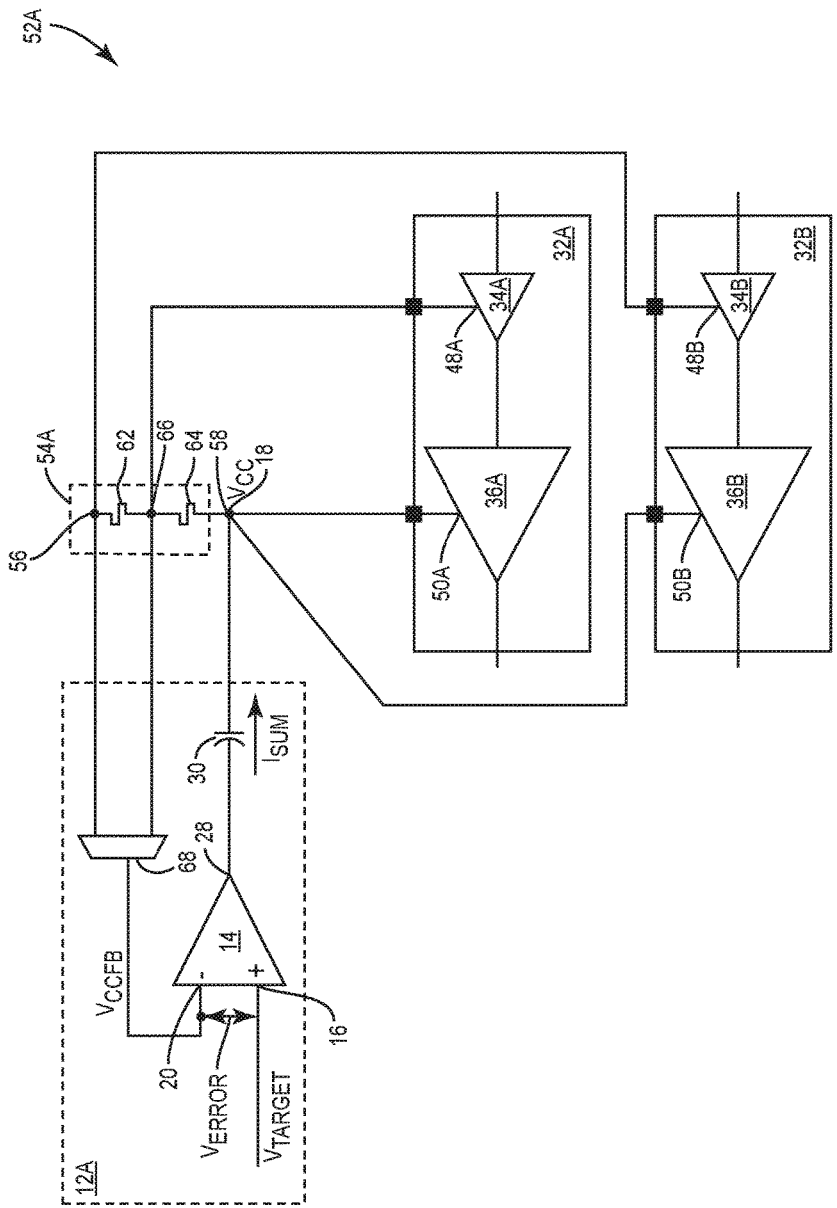
FIG. 3 is a schematic diagram of an exemplary ET power amplifier circuit configured to support a first power amplifier circuit and a second power amplifier circuit with different current ratios.

Notably, the ET power amplifier circuit 52 can be configured to support more than one power amplifier circuit having different current ratios K. Hence, it may be necessary to vary the adjustment inductance $L_{ADJ}$ in accordance to equation (Eq. 7) for the different current ratios K. In this regard, FIG. 3 is a schematic diagram of an exemplary ET power amplifier circuit 52A configured to support a first power amplifier circuit 32A with a first current ratio $K_1$ and a second power amplifier circuit 32B with a second current ratio $K_2$. Common elements between FIGS. 2 and 3 are shown therein with common element numbers and will not be re-described herein.

The ET power amplifier circuit 52A includes ET tracker circuitry 12A that has the output inductance $L_{ZOUT}$ equivalent to the output inductance $L_{ZOUT}$ of the ET tracker circuitry 12 of FIG. 2. In a non-limiting example, the second current ratio $K_2$ of the second power amplifier circuit 32B is greater than the first current ratio $K_1$ of the first power amplifier circuit 32A. Thus, according to equation (Eq. 7), it would require a higher adjustment inductance $L_{ADJ}$ to offset the output inductance $L_{ZOUT}$ for the second power amplifier circuit 32B. As such, in a non-limiting example, the ET power amplifier circuit 52A includes impedance adjustment circuitry 54A. The impedance adjustment circuitry 54A includes a first inductor 62 and a second inductor 64 provided in a serial arrangement between the first node 56 and the second node 58. More specifically, the first inductor 62 is provided between the first node 56 and an intermediate node 66 and the second inductor 64 is provided between the intermediate node 66 and the second node 58.

The first power amplifier circuit 32A, which has the first current ratio $K_1$ smaller than the second current ratio $K_2$, includes a respective first amplifier 34A and a respective second amplifier 36A. The respective first amplifier 34A has a respective first voltage input 48A coupled to the intermediate node 66. The respective second amplifier 36A has a respective second voltage input 50A coupled to the second node 58. As such, the second inductor 64 provides the adjustment inductance $L_{ADJ}$ to offset the output inductance $L_{ZOUT}$ for the first power amplifier circuit 32A. Notably, inductance of the second inductor 64 can be so determined based on the first current ratio $K_1$ and in accordance to equation (Eq. 7).

The second power amplifier circuit 32B includes a respective first amplifier 34B and a respective second amplifier 36B. The respective first amplifier 34B has a respective first voltage input 48B coupled to the first node 56. The respective second amplifier 36B has a respective second voltage input 50B coupled to the second node 58. As such, the first inductor 62 and the second inductor 64 provide the adjustment inductance $L_{ADJ}$ to offset the output inductance $L_{ZOUT}$ for the second power amplifier circuit 32B. Notably, inductances of the first inductor 62 and the second inductor 64 can be so determined based on the second current ratio $K_2$ and in accordance to equation (Eq. 7).

The ET tracker circuitry 12A includes a mux 68. The mux 68 is configured to selectively provide the feedback voltage $V_{CCFB}$ from the intermediate node 66 when the first power amplifier circuit 32A is in use or from the first node 56 when the second power amplifier circuit 32B is in use.

Figure 4:
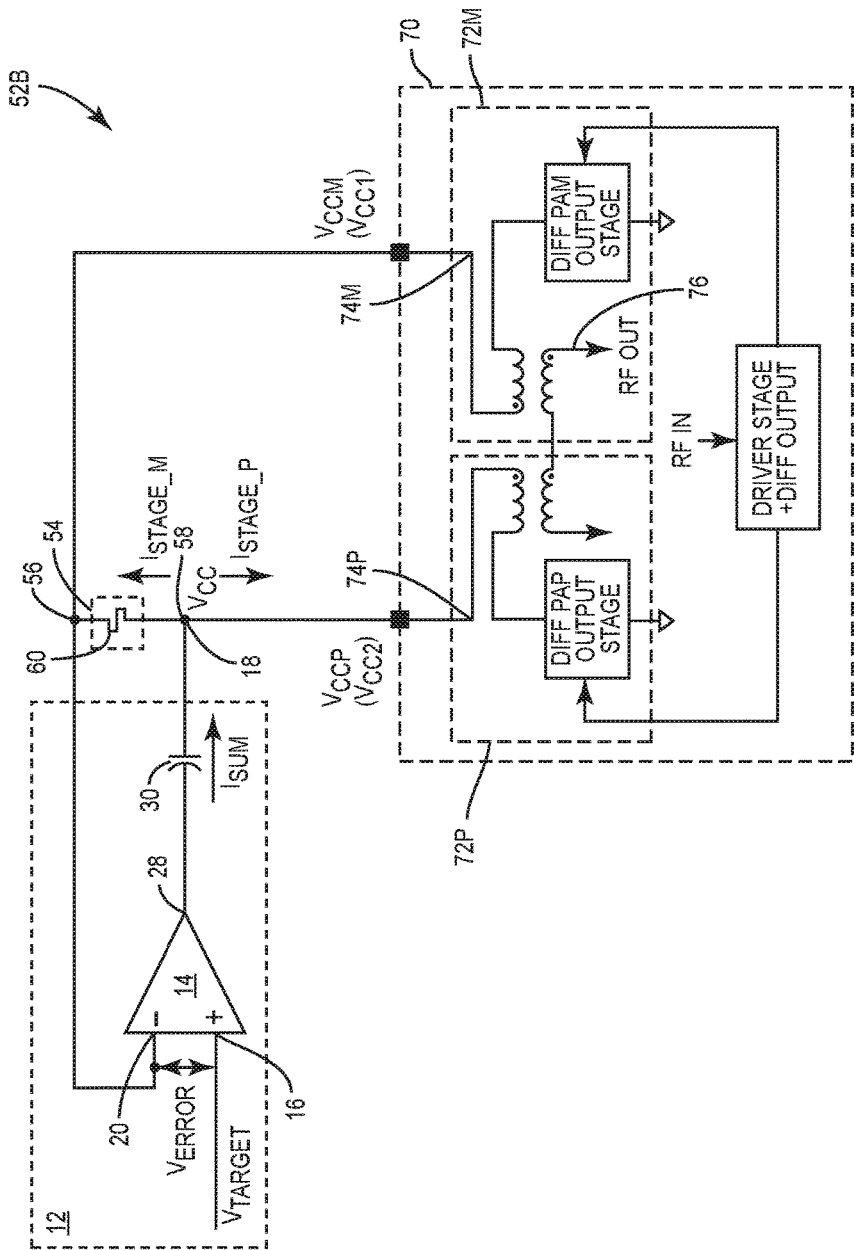
FIG. 4 is a schematic diagram of an exemplary ET power amplifier circuit including a differential power amplifier circuit.

The impedance adjustment circuitry 54 of FIG. 2 can be further configured to offset the output inductance $L_{ZOUT}$ of the ET tracker circuitry 12 when the power amplifier circuit 32 is provided as a differential power amplifier circuit. In this regard, FIG. 4 is a schematic diagram of an exemplary ET power amplifier circuit 52B including the ET tracker circuitry 12 of FIG. 2 and a differential power amplifier circuit 70. Common elements between FIGS. 2 and 4 are shown therein with common element numbers and will not be re-described herein.

The differential power amplifier circuit 70 includes a plus amplifier 72P and a minus amplifier 72M. The plus amplifier 72P has a plus supply voltage input 74P coupled to the second node 58 to receive a plus ET modulated supply voltage $V_{CCP}$. The minus amplifier 72M has a minus supply voltage input 74M coupled to the first node 56 to receive a minus ET modulated supply voltage $V_{CCM}$. The plus ET modulated supply voltage $V_{CCP}$ creates a plus current $I_{STAGE\_P}$ in the plus amplifier 72P. Likewise, the minus ET modulated supply voltage $V_{CCM}$ creates a minus current $I_{STAGE\_M}$ in the minus amplifier 72M.

Assuming that the plus current $I_{STAGE\_P}$ equals the minus current $I_{STAGE\_M}$ and further equals the second current $I_{STAGE2}$ as previously shown in FIG. 2, the plus ET modulated supply voltage $V_{CCP}$ and the minus ET modulated supply voltage $V_{CCM}$ can be expressed in equation (Eq. 8) below.

$$V_{CCM}=V_{TARGET}-L_{ZOUT}*d(2*I_{STAGE2})/dt$$

$$V_{CCP}=V_{TARGET}-L_{ZOUT}*d(2*I_{STAGE2})/dt+L_{ADJ}*d (I_{STAGE2})/dt \quad (Eq. 8)$$

If the adjustment inductance $L_{ADJ}$ is selected to equal four times the output inductance $L_{ZOUT}$, then the equation (Eq. 8) can be rewritten as equation (Eq. 8.1) below.

$$V_{CCM} = V_{TARGET} - 2*L_{ZOUT}*d(I_{STAGE2})/dt$$

$$V_{CCP} = V_{TARGET} + 2*L_{ZOUT}*d(I_{STAGE2})/dt \quad \text{(Eq. 8.1)}$$

As shown in equation (Eq. 8.1), the output inductance $L_{ZOUT}$ will induce an opposite ripple on the minus ET modulated supply voltage $V_{CCM}$ and the plus ET modulated supply voltage $V_{CCP}$. The opposite ripple will cancel out at an RF output 76, thus helping to reduce the voltage error $V_{ERROR}$.

Figure 5:
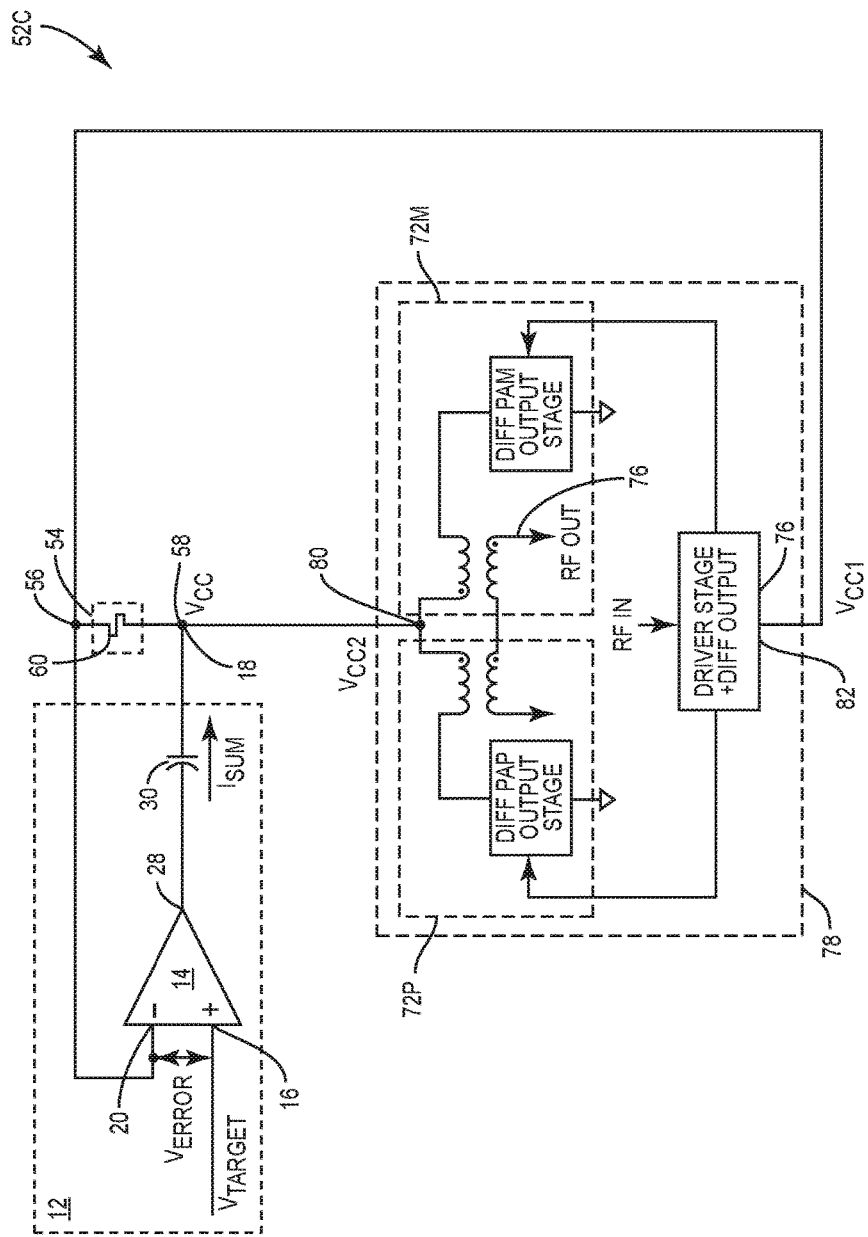
FIG. 5 is a schematic diagram of an exemplary ET power amplifier circuit including the ET tracker circuitry of FIG. 2 and a differential power amplifier circuit according to a different configuration from the differential power amplifier circuit of FIG. 4.

FIG. 5 is a schematic diagram of an exemplary ET power amplifier circuit 52C including the ET tracker circuitry 12 of FIG. 2 and a differential power amplifier circuit 78 according to a different configuration from the differential power amplifier circuit 70 of FIG. 4. Common elements between FIGS. 2, 4, and 5 are shown therein with common element numbers and will not be re-described herein.

As shown in FIG. 5, the plus amplifier 72P and the minus amplifier 72M are provided in parallel between a first voltage node 80 coupled to the second node 58 and a second voltage node 82 coupled to the first node 56.

Those skilled in the art will recognize improvements and modifications to the embodiments of the present disclosure. All such improvements and modifications are considered within the scope of the concepts disclosed herein and the claims that follow.

What is claimed is:

1. An envelope tracking (ET) power amplifier circuit, comprising:
    ET tracker circuitry having an output impedance and configured to receive an ET modulated target voltage having a target voltage envelope at a voltage input and generate an ET modulated output voltage having an output voltage envelope tracking the target voltage envelope at a voltage output;
    impedance adjustment circuitry comprising a first node coupled to a feedback voltage input of the ET tracker circuitry and a second node coupled to the voltage output, the impedance adjustment circuitry configured to provide an adjustment impedance between the first node and the second node; and
    at least one power amplifier circuit comprising:
        a first amplifier comprising a first voltage input coupled to the first node of the impedance adjustment circuitry; and
        a second amplifier comprising a second voltage input coupled to the second node of the impedance adjustment circuitry.

2. The ET power amplifier circuit of claim 1 wherein:
    the output impedance of the ET tracker circuitry causes a voltage error between the output voltage envelope and the target voltage envelope; and
    the impedance adjustment circuitry is further configured to provide the adjustment impedance to offset the output impedance of the ET tracker circuitry to reduce the voltage error between the output voltage envelope and the target voltage envelope.

3. The ET power amplifier circuit of claim 2 wherein the impedance adjustment circuitry is further configured to provide the adjustment impedance to offset at least ninety percent of the output impedance.

4. The ET power amplifier circuit of claim 1 wherein the output impedance is determined by an output inductance of the ET tracker circuitry.

5. The ET power amplifier circuit of claim 4 wherein the impedance adjustment circuitry comprises at least one inductor configured to generate an adjustment inductance to offset the output inductance of the ET tracker circuitry.

6. The ET power amplifier circuit of claim 5 wherein:
    the first amplifier is configured to receive a first ET modulated supply voltage from the first node; and
    the second amplifier is configured to receive a second ET modulated supply voltage from the second node.

7. The ET power amplifier circuit of claim 6 wherein the second ET modulated supply voltage is greater than the first ET modulated supply voltage.

8. The ET power amplifier circuit of claim 6 wherein:
    the first amplifier is configured to receive a radio frequency (RF) signal at a first signal input and output the RF signal at a first signal output; and
    the second amplifier is configured to receive the RF signal at a second signal input coupled to the first signal output and output the RF signal at a second signal output.

9. The ET power amplifier circuit of claim 6 wherein:
    the first ET modulated supply voltage induces a first current in the first amplifier;
    the second ET modulated supply voltage induces a second current in the second amplifier; and
    the second current equals the first current multiplied by a current ratio greater than one.

10. The ET power amplifier circuit of claim 9 wherein the impedance adjustment circuitry is further configured to generate the adjustment inductance varying in proportion to the output inductance and the current ratio.

11. The ET power amplifier circuit of claim 10 wherein the adjustment inductance generated by the at least one inductor in the impedance adjustment circuitry equals the output inductance plus a multiplication of the output inductance and the current ratio.

12. The ET power amplifier circuit of claim 1 wherein the at least one power amplifier circuit comprises a first power amplifier circuit having a first current ratio and a second power amplifier circuit having a second current ratio greater than the first current ratio.

13. The ET power amplifier circuit of claim 12 wherein the impedance adjustment circuitry comprises a first inductor and a second inductor provided in a serial arrangement between the first node and the second node, the first inductor is provided between the first node and an intermediate node, and the second inductor is coupled between the intermediate node and the second node.

14. The ET power amplifier circuit of claim 13 wherein the first power amplifier circuit comprises a respective first amplifier having a respective first voltage input coupled to the intermediate node and a respective second amplifier having a respective second voltage input coupled to the second node.

15. The ET power amplifier circuit of claim 13 wherein the first power amplifier circuit comprises a respective first amplifier having a respective first voltage input coupled to the first node and a respective second amplifier having a respective second voltage input coupled to the second node.

16. The ET power amplifier circuit of claim 1 wherein the at least one power amplifier circuit is a differential power amplifier circuit comprising a plus amplifier and a minus amplifier.

17. The ET power amplifier circuit of claim 16 wherein the plus amplifier and the minus amplifier are provided in parallel between a first voltage node coupled to the first node and a second voltage node coupled to the second node.

18. The ET power amplifier circuit of claim 16 wherein:
the plus amplifier has a plus supply voltage input coupled to the second node; and
the minus amplifier has a minus supply voltage input coupled to the first node.

19. The ET power amplifier circuit of claim 18 wherein:
the output impedance is determined by an output inductance of the ET tracker circuitry; and
the impedance adjustment circuitry comprises at least one inductor configured to generate an adjustment inductance to offset the output inductance of the ET tracker circuitry.

20. The ET power amplifier circuit of claim 19 wherein the adjustment inductance equals four times the output inductance.

* * * * *